United States Patent
Shah et al.

(10) Patent No.: US 11,513,242 B1
(45) Date of Patent: Nov. 29, 2022

(54) DOPED SEMICONDUCTOR-BASED RADIATION DETECTORS

(71) Applicant: Radiation Monitoring Devices, Inc., Watertown, MA (US)

(72) Inventors: Kanai S. Shah, Watertown, MA (US); Leonard Cirignano, Cambridge, MA (US); Hadong Kim, Methuen, MA (US); Alexei Churilov, Waltham, MA (US); Andrey Gueorguiev, Burlington, MA (US); Alireza Kargar, Watertown, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 14/637,434

(22) Filed: Mar. 4, 2015

Related U.S. Application Data

(60) Provisional application No. 61/949,560, filed on Mar. 7, 2014.

(51) Int. Cl.
*G01T 1/24* (2006.01)
*H01L 31/032* (2006.01)

(52) U.S. Cl.
CPC .......... *G01T 1/24* (2013.01); *H01L 31/0321* (2013.01)

(58) Field of Classification Search
CPC ......... G01T 1/202; G01T 1/2023; G01T 1/24; C09K 11/02; C09K 11/616; H01L 31/0321
See application file for complete search history.

(56) References Cited

U.S. PATENT DOCUMENTS

| | | | |
|---|---|---|---|
| 8,227,204 B2 * | 7/2012 | Boyden | A61K 41/0042 435/4 |
| 8,779,365 B2 * | 7/2014 | Williams | G01T 1/2023 250/361 R |
| 10,371,831 B2 | 8/2019 | Shah et al. | |
| 2014/0097349 A1 * | 4/2014 | Leao | C30B 11/06 250/370.12 |
| 2017/0355905 A1 * | 12/2017 | Bizarri | G01T 1/2023 |
| 2018/0155620 A1 * | 6/2018 | Stand | G21K 4/00 |

OTHER PUBLICATIONS

"Simultaneous Control of Ionic and Electronic Conductivity in Materials: Thallium Bromide Case Study" Physical Review Letters 108, 246604 (2012) Leão et al.*
"Advances in TlBr detector development" Journal of Crystal Growth 379 (2013) 93-98 to Hitomi et al.*

(Continued)

*Primary Examiner* — Mark R Gaworecki
(74) *Attorney, Agent, or Firm* — Wolf, Greenfield & Sacks, P.C.

(57) ABSTRACT

A radiation detector is generally described. The detector can comprise a thallium halide (e.g., TlBr) and/or an indium halide. The thallium halide and/or indium halide can be doped with a dopant or a mixture of dopants. The dopant can comprise an alkaline earth metal element, a lanthanide element, and/or an element with an oxidation state of +2. Non-limiting examples of suitable dopants include Ba, Sr, Ca, Mg, La, Ce, Pr, Nd, Pm, Sm, Eu, Gd, Tb, Dy, Ho, Er, Tm, and/or Yb. Radiation detectors, as described herein, may have beneficial properties, including enhanced charge collection and long-term stability.

10 Claims, 6 Drawing Sheets

(56) References Cited

OTHER PUBLICATIONS

"Recent Progress in Thallium Bromide Gamma-Ray Spectrometer Development" IEEE Transactions on Nuclear Science 59, 1 (2012) 243-248 to Kim et al.*
"Quantum Dots in Semiconductor Optoelectronic Devices" to the Electrochemical Society Interface, Winter 2006, p. 23-27 to Stokes et al.*
"Kinetics of the Current Response in TlBr Detectors Under a High Dose Rate of Gamma Ray Irradiation" Semiconductors, 2012, vol. 46, No. 3, pp. 391-396, Gazizov et al. (Year: 2012).*

* cited by examiner

DOPED SEMICONDUCTOR-BASED RADIATION DETECTORS

RELATED APPLICATIONS

This application claims priority to U.S. Provisional Application No. 61/949,560, filed Mar. 7, 2014, which is incorporated herein by reference in its entirety.

TECHNICAL FIELD

Doped semiconductor-based radiation detectors and methods of using thereof are generally described.

BACKGROUND

Radiation detection is of major interest in a host of applications, including nuclear medicine, fundamental physics, industrial gauging, baggage scanning, and oil well logging.

Semiconductor detectors, such as silicon avalanche photodiodes (Si-APDs), are widely used for the detection of x-rays, gamma rays, and particles such as neutrons and alpha particles. Thallium halide (e.g., thallium bromide) and/or indium halide detectors can have advantages compared to other semiconductor detectors, such as higher photoelectric and total attenuation coefficients. Additionally, thallium halide and/or indium halide detectors can operate at room temperature with low dark current in the same manner as other semiconductor detectors. However, thallium halide and/or indium halide detectors generally have not been widely used due to performance problems, such as reduced internal field and detector instability, which can result from polarization under applied bias at room temperature. Accordingly, improved detectors and methods would be useful.

SUMMARY

Doped semiconductor-based radiation detectors and methods of using thereof are generally described.

In one set of embodiments, a radiation detector comprises a thallium halide and/or an indium halide and a dopant selected from the group consisting of an alkaline earth metal element, a lanthanide element, and/or an element with an oxidation state of +2.

In another set of embodiments, a method of detecting radiation comprises exposing a radiation detector to a source of radiation, wherein the radiation detector comprises a thallium halide and/or an indium halide and a dopant selected from the group consisting of an alkaline earth metal element, a lanthanide element, and/or an element with an oxidation state of +2, and generating an electrical signal.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

DETAILED DESCRIPTION

Figure 1A:
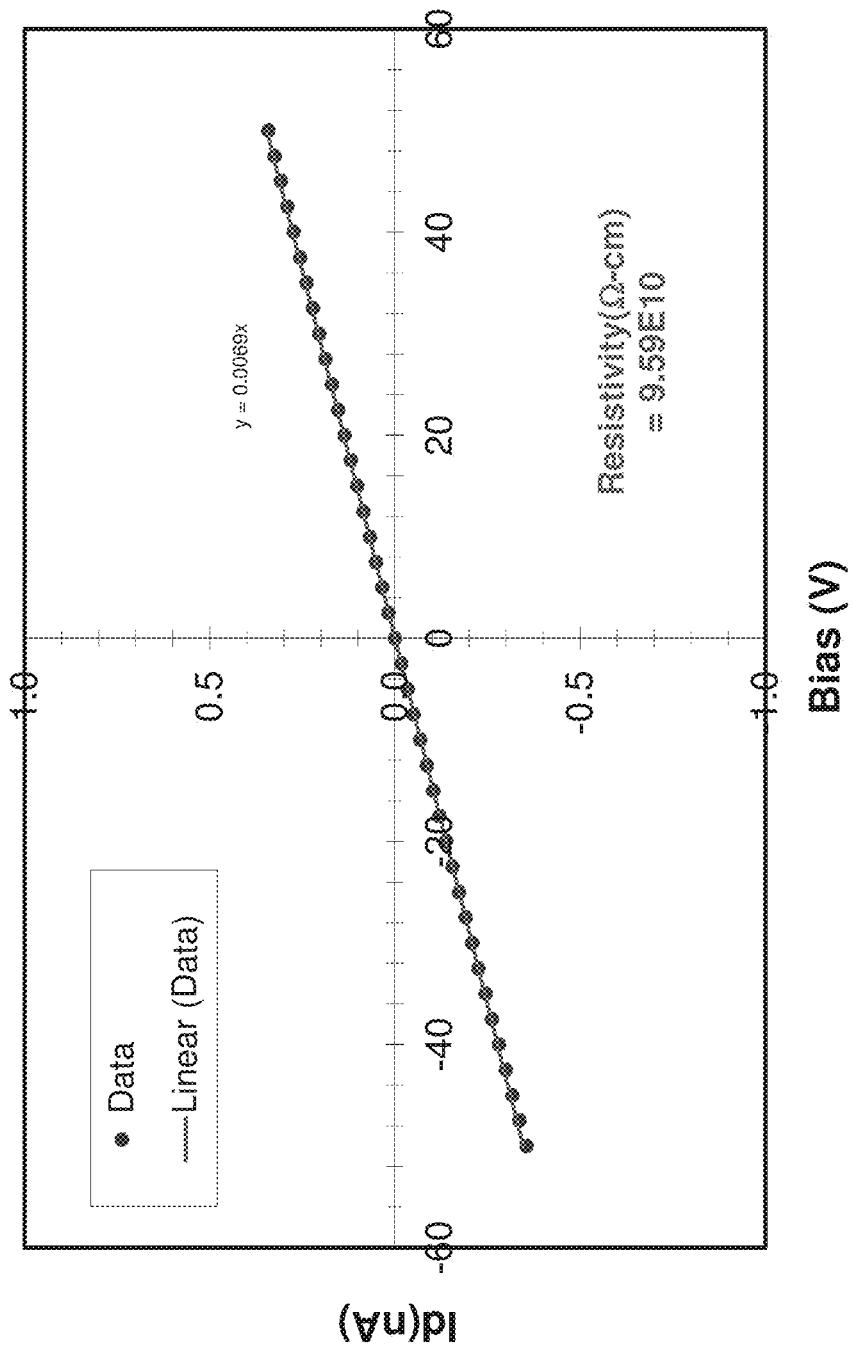
FIGS. 1A-C show, for a sample radiation detector described in Example 1: (A) representative resistivity measurements; (B) representative pulse height spectra obtained at different bias voltages; and (C) representative pulse height spectra recorded at various times.

A semiconductor-based radiation detector is generally described. The semiconductor-based radiation detector can comprise a thallium halide (e.g., TlBr) and/or an indium halide. In some embodiments, the thallium halide and/or indium halide is doped with a dopant or a mixture of dopants (e.g., two or more dopants). The dopant can comprise an alkaline earth metal element, a lanthanide element, and/or an element with an oxidation state of +2. Suitable dopants include, but are not limited to, barium (Ba), calcium (Ca), strontium (Sr), magnesium (Mg), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), and/or ytterbium (Yb). As described herein, doped thallium halide and/or indium halide radiation detectors can have beneficial properties, such as enhanced charge collection and long-term stability.

In some embodiments, a composition for use in a radiation detector comprises a thallium halide (e.g., a compound of thallium and one or more halide elements). For example, the composition may comprise thallium bromide, thallium iodide, thallium chloride, thallium fluoride, thallium bromochloride, thallium bromoiodide, or combinations thereof. In some embodiments, the composition comprises an indium halide (e.g., a compound of indium and one or more halide elements). For example, the composition may comprise indium bromide, indium iodide, indium chloride, indium fluoride, indium bromochloride, indium bromoiodide, or combinations thereof. In some embodiments, the composition comprises a thallium halide and an indium halide. A person of ordinary skill in the art would generally recognize a thallium halide or an indium halide to be a semiconductor material.

In some embodiments, the composition for use in a radiation detector comprises a dopant or a mixture of dopants. As used herein, a dopant or doping agent refers to a substance that is added in trace amounts to a semiconductor material such that the dopant affects the semiconductor material's electrical characteristics (e.g., resistivity). In some embodiments, the dopant comprises an alkaline earth metal element (e.g., Ba, Sr, Ca, Mg). In some embodiments, the dopant comprises a lanthanide element (e.g., La, Ce, Pr, Nd, Pm, Sm, Eu, Gd, Tb, Dy, Ho, Er, Tm, Yb). In some embodiments, the dopant comprises an element having an oxidation state of +2. In some embodiments, $Ba^{2+}$ is a preferred dopant. The dopant can be supplied in various forms, such as halides (e.g., barium bromide). A mixture of dopants can comprise any combination of one or more alkaline earth metal elements, lanthanide elements, and/or elements having an oxidation state of +2.

The amount of a dopant present in the composition is generally relatively low. In some embodiments, the dopant is employed at a level in the range of about 0.1% to about 1.0% by molar weight or about 0.1% to about 5.0% by molar weight. In some embodiments, the amount of a dopant present is less than or equal to about 100 parts per million (ppm), less than or equal to about 50 ppm, less than or equal to about 10 ppm, less than or equal to about 5 ppm, less than or equal to about 2 ppm, or less than or equal to about 1 ppm. In some embodiments, the amount of a dopant present is greater than or equal to about 1 ppm, greater than or equal to about 2 ppm, or greater than or equal to about 10 ppm. It should be understood that all combinations of the above-referenced ranges are also possible (e.g., greater than or equal to about 1 ppm and less than or equal to about 100 ppm).

The doped thallium halide and/or indium halide compositions described herein can have properties that are advantageous in radiation detector applications. In some embodiments, the composition has a relatively wide band gap. For example, the composition can have a band gap greater than or equal to about 1 eV, greater than or equal to about 1.5 eV, greater than or equal to about 2 eV, or greater than or equal to about 2.5 eV. In some embodiments, the composition has a relatively high average atomic number. For example, the composition can have an average atomic number greater than or equal to about 40 or greater than or equal to about 50. In some embodiments, the composition has a relatively high density. For example, the density can be greater than or equal to about 3 g/cm$^3$, greater than or equal to about 5 g/cm$^3$, or greater than or equal to about 7 g/cm$^3$.

Figure 3:
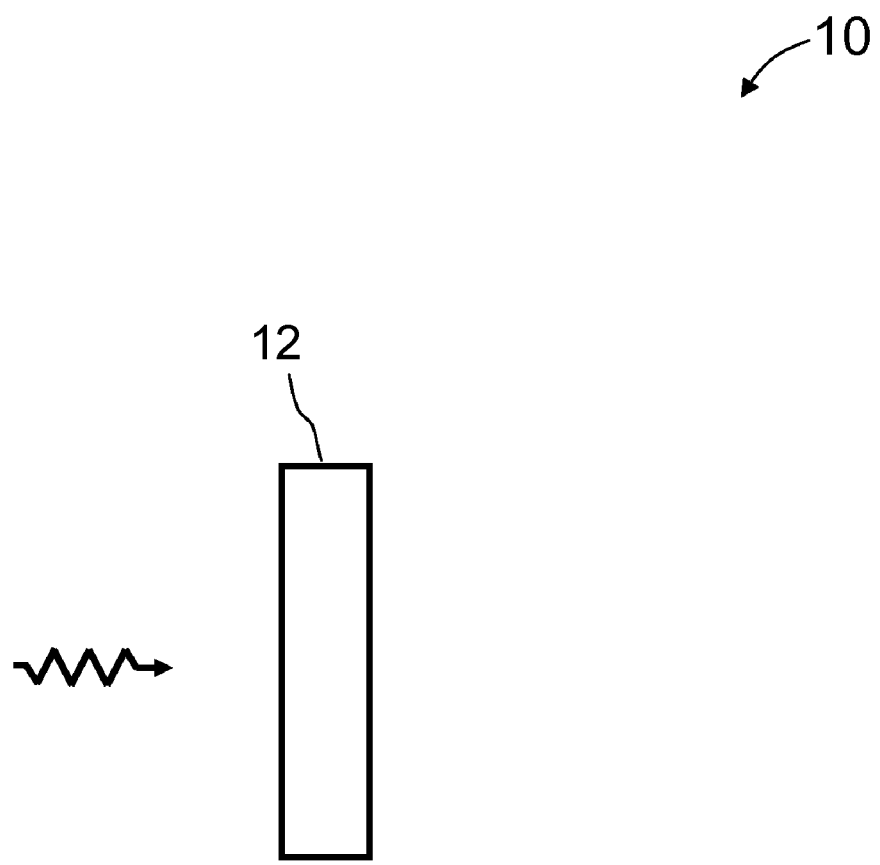
FIG. 3 schematically illustrates a radiation detector.

In some embodiments, as shown in FIG. 3, a radiation detector 10 comprises a planar layer 12 of the doped thallium halide and/or indium halide composition. In some embodiments, the composition has a thickness of greater than or equal to about 0.5 mm, greater than or equal to about 1 mm, greater than or equal to about 5 mm, greater than or equal to about 10 mm, or greater than or equal to about 15 mm. In some instances, the composition has a thickness of less than or equal to about 20 mm, less than or equal to about 15 mm, less than or equal to about 10 mm, or less than or equal to about 5 mm. It should be understood that all combinations of the above-referenced ranges are also possible (e.g., greater than or equal to about 5 mm and less than or equal to about 20 mm). The cross section of the planar layer (e.g., in the plane perpendicular to the thickness of the layer) can have any shape. For example, the cross-sectional shape of the planar layer of the composition can be a square, rectangle, circle, ellipse, triangle, hexagon, or any other shape. In some embodiments, the doped composition is lapped, polished, and/or etched prior to use in a radiation detector. For example, the doped composition can be chemically etched (e.g., with bromine methanol) to remove surface defects.

As mentioned above, a radiation detector may comprise a composition comprising thallium halide and/or indium halide and a dopant or a mixture of dopants. In some embodiments, the radiation detector further comprises other components. For example, the radiation detector may further comprise a substrate (e.g., a ceramic substrate). In some cases, the radiation detector may comprise one or more electrode contacts. The electrode contacts may be formed on the semiconductor material to provide a voltage to the detector during use. In some embodiments, at least one of the electrode contacts comprises a metal. Non-limiting examples of suitable metals include Au, Cr, Ti, W, Mo, and Pb. In some embodiments, at least one of the electrode contacts comprises a liquid that contains ions. Any suitable liquid may be used in the electrode contact.

In some embodiments, a radiation detector comprising a doped thallium halide and/or indium halide composition has relatively high resistivity. It may be beneficial, in some cases, for a radiation detector to have a relatively high resistivity in order to reduce dark current (e.g., current that is present in the absence of radiation) and noise. In some embodiments, the resistivity may be greater than or equal to about $5\times10^{10}$ ohm-cm, greater than or equal to about $1\times10^{11}$ ohm-cm, greater than or equal to about $1.5\times10^{11}$ ohm-cm, greater than or equal to about $2\times10^{11}$ ohm-cm, greater than or equal to about $2.5\times10^{11}$ ohm-cm, or greater than or equal to about $3\times10^{11}$ ohm-cm. In some embodiments, resistivity may be obtained from the slope of a current-voltage ("I-V") curve near the origin.

In some embodiments, the radiation detector may have charge carrier (e.g., electron, hole) transport properties that are beneficial for radiation detection applications. Important charge carrier transport properties include mobility ($\mu$), which relates to how fast a charge carrier travels in an electric field, trapping lifetime ($\tau$), which relates to the average time a charge carrier generated by ionizing radiation is able to participate in a transport process, and mobility-lifetime product ($\mu\tau$), which is the product of mobility and trapping lifetime. The electron mobility-lifetime product, $(\mu\tau)_e$, can have a different value from the hole mobility-lifetime product, $(\mu\tau)_h$. In some cases, it may be beneficial to have relatively high electron and/or hole mobility-lifetime products. For example, relatively high electron and/or hole mobility-lifetime products can lead to high charge collection efficiency. In some embodiments, the electron mobility-lifetime product $(\mu\tau)_e$ is at least about 0.006 cm$^2$/V. In some embodiments, the hole mobility-lifetime product $(\mu\tau)_h$ is at least about 0.0004 cm$^2$/V.

Radiation detectors comprising a doped thallium halide and/or indium halide composition, described herein, may exhibit stability (e.g., no polarization, little polarization) over a relatively long period of time. In some embodiments, radiation detectors described herein may exhibit enhanced stability at higher temperatures (e.g., room temperature) than conventional semiconductor materials. Stability may be determined, in some cases, by continuously applying a bias voltage (e.g., 100 V, 500 V, or any other suitable voltage) to a radiation detector and periodically recording the response of the detector to a radiation source (e.g., a gamma ray source) at room temperature to obtain a pulse height spectrum. In some embodiments, the gamma ray source comprises $^{241}$Am. The gamma rays emitted from the gamma ray source may have an energy of about 60 keV. As used herein, stability generally refers to the number of days that the coefficient of variation of the peak position (i.e., peak centroid location) on a pulse height spectrum is less than or equal to about 10% (e.g., less than or equal to about 8%, less than or equal to about 5%, less than or equal to about 3%, or less than or equal to about 1%). In some embodiments, the stability of a radiation detector is greater than about 5 days, greater than about 25 days, greater than about 50 days, greater than about 100 days, greater than about 150 days, greater than about 200 days, greater than about 250 days, greater than about 300 days, or greater than about 325 days.

It should be understood that the detectors, as described herein, can be used to detect radiation. In some embodiments, the radiation comprises gamma rays. In some cases, the gamma rays may be emitted by a nucleus (e.g., during a radioactive decay process). In some embodiments, the gamma rays have an energy of greater than or equal to about 20 keV, greater than or equal to about 100 keV, greater than or equal to about 200 keV, greater than or equal to about 500 keV, or greater than or equal to about 1 MeV.

Some embodiments are directed to methods for detecting radiation. A method for detecting radiation may comprise exposing a radiation detector to radiation (e.g., gamma rays) and generating an electrical signal. In some instances, the presence or absence of gamma radiation may be determined by the presence or absence, respectively, of an electrical signal.

In some embodiments, a method for detecting radiation may be carried out by a detector assembly. The detector assembly may comprise a radiation detector comprising a thallium halide and/or an indium halide, a dopant or a mixture of dopants, and one or more electrode contacts. The detector assembly may further comprise an anode, a cathode, and one or more wires (e.g., palladium wires) connecting the anode and the cathode to the one or more electrode contacts of the radiation detector. A bias voltage may be applied across the radiation detector. Upon exposure of the detector assembly to a source of radiation, the radiation detector may generate electron-hole pairs. In some instances, exposure to a source of radiation may generate ion vacancies in the radiation detector. Due to the applied bias voltage, the electrons, holes, and/or ion vacancies may travel to the electrode contacts of the radiation detector. The flow of electrons, for example, may generate an electrical signal that can be detected and/or measured. The electrical signal generated may be proportional to the energy of the radiation absorbed by the radiation detector.

In some embodiments, a detector assembly can include a data analysis or computer system (e.g., data acquisition and/or processing device) to process information from the radiation detector. The detector assembly can convert the absorbed radiation into an electrical signal that may be shaped, digitized, or processed, for example, by the associated electronics.

The data analysis, or computer system thereof can include, for example, a module or system to process information (e.g., radiation detection data or signals) from the radiation detector and can further include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in a tangible media such as a memory, a digital or optical recording media, optical, electrical, or wireless telemetry signals, or the like, and one or more of these structures may also be used to transmit data and information between components of the system in any of a wide variety of distributed or centralized signal processing architectures.

The detector system can be connected to a variety of tools and devices. Non-limiting examples include nuclear weapons monitoring and detection devices, well-logging tools, and imaging devices, such as nuclear medicine devices (e.g., PET). Doped thallium halide and/or indium halide compositions of the present invention, e.g., due to high-detection efficiency and/or relatively thin profile or sizing, can be incorporated into smaller or more compact devices or systems, including hand-held probes, detectors, or dosimeters, portal monitoring structures, and the like.

The detector system may also be connected to a visualization interface, imaging equipment, or digital imaging equipment.

The following examples are intended to illustrate certain embodiments of the present invention, but do not exemplify the full scope of the invention.

EXAMPLES

Example 1

This example describes the resistivity and stability of a radiation detector comprising barium-doped thallium bromide.

An amount of barium bromide ($BaBr_2$) was placed at the seed end of a zone-refined ingot of TlBr. The TlBr ingot was reloaded into a zone refiner, where it underwent a final crystal growth pass. During the final crystal growth pass, the barium spread and mixed with the TlBr crystal.

A radiation detector comprising a 1.07 mm-thick layer of the barium-doped TlBr ingot was fabricated. FIG. 1A shows a plot of current (nA) versus voltage (V) for the detector. A line was fit through the data points, and the resistivity was obtained from the slope of the line. The resistivity of the detector was determined to be $9.59 \times 10^{10}$ ohm-cm.

Figure 1B:
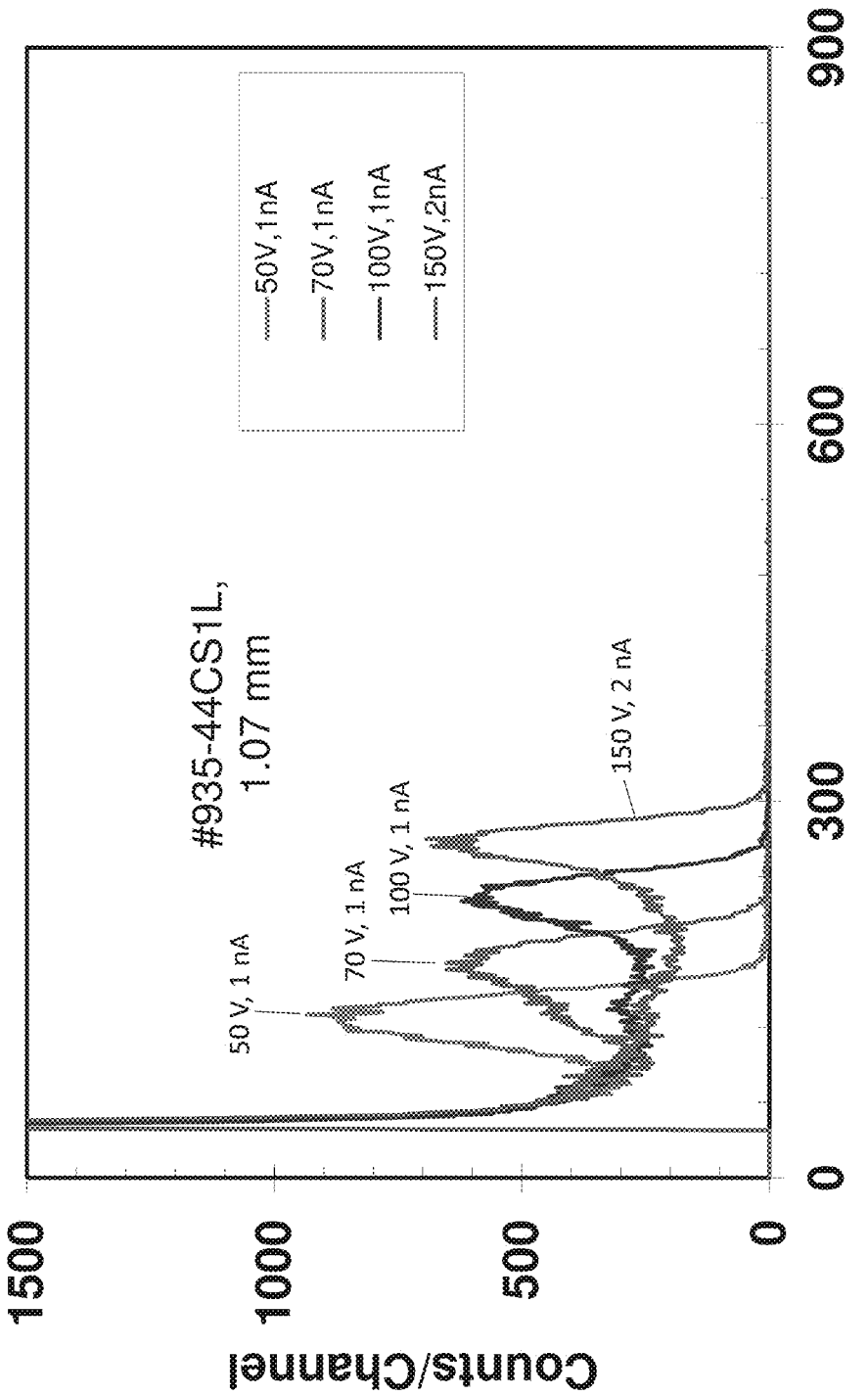

Additionally, bias voltages ranging from 50 to 150 V were applied across the radiation detector, and the detector was exposed to a radiation source emitting 60 keV gamma rays. FIG. 1B shows the pulse height spectra that were obtained at the various applied bias voltages. As illustrated by the pulse height spectra, the Ba-doped TlBr detector demonstrated good charge collection.

Figure 1C:
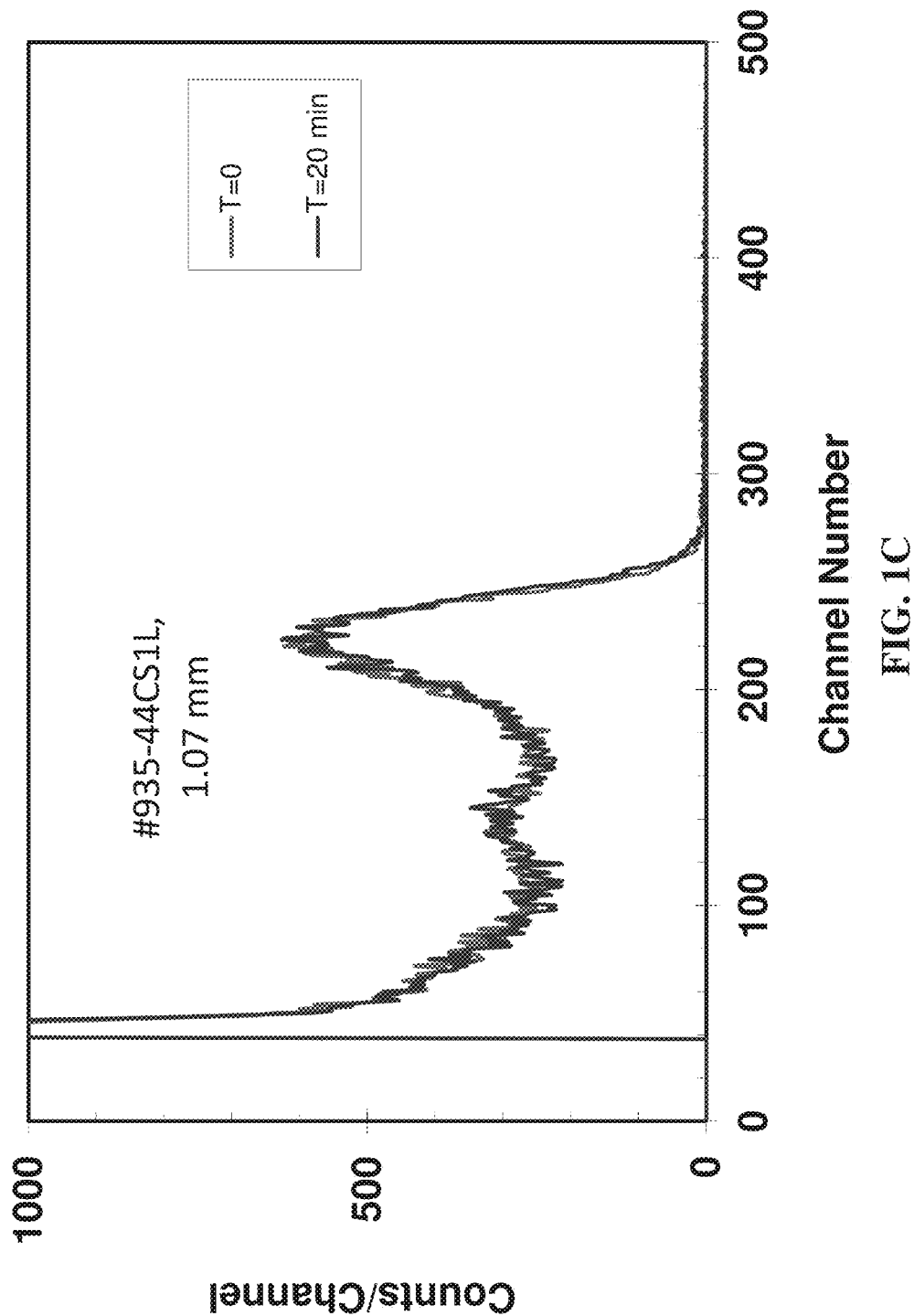

The stability of the Ba-doped TlBr detector was also evaluated. FIG. 1C shows pulse height spectra obtained at an initial time and 20 minutes after the initial time. As can be seen from the figure, no shift in peak position was observed after 20 minutes.

Example 2

This example describes the resistivity and stability of radiation detectors comprising TlBr and varying amounts of barium.

Figure 2A:
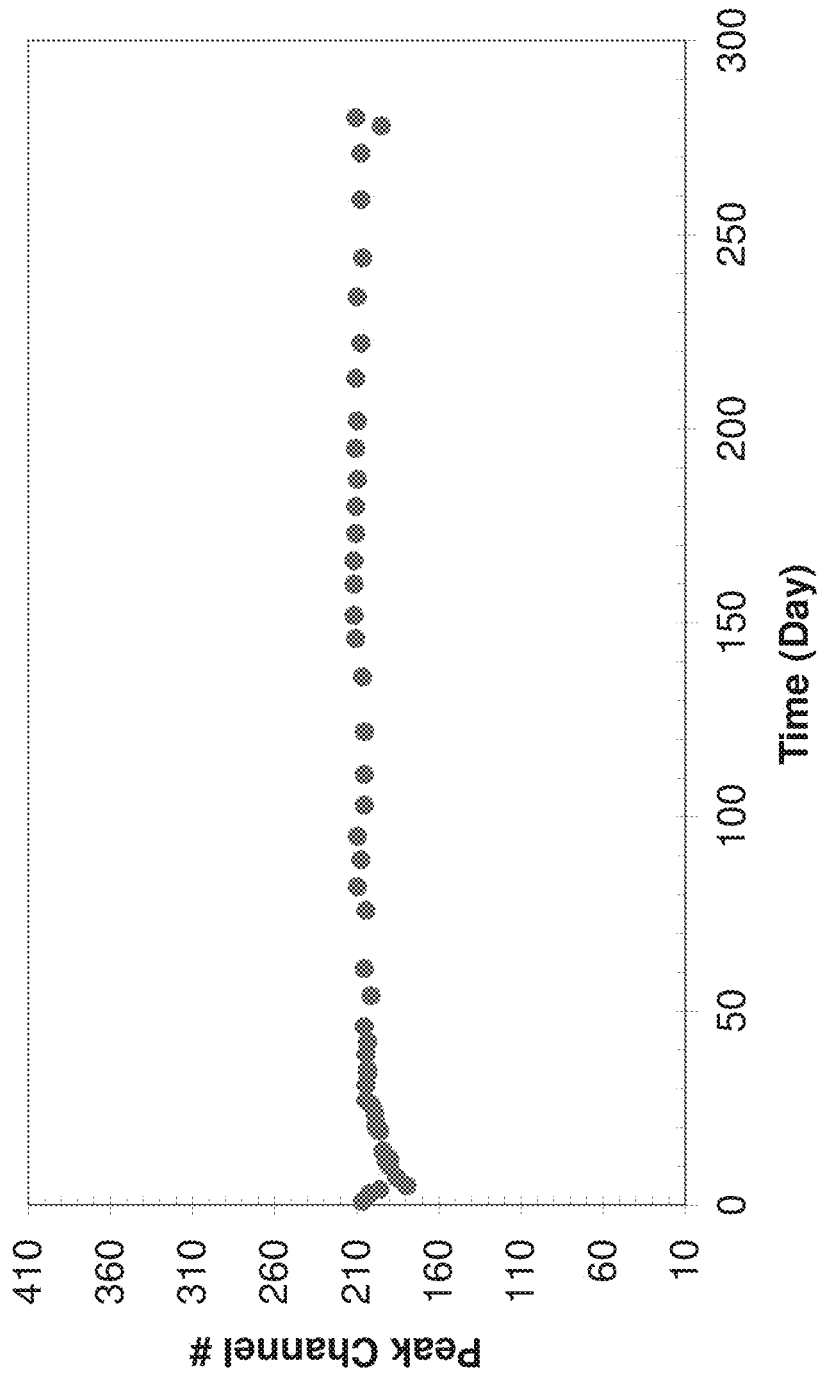
FIGS. 2A-B show, for one of the sample radiation detectors described in Example 2: (A) a representative plot of peak position as a function of time; and (B) representative pulse height spectra recorded at various times.
Figure 2B:
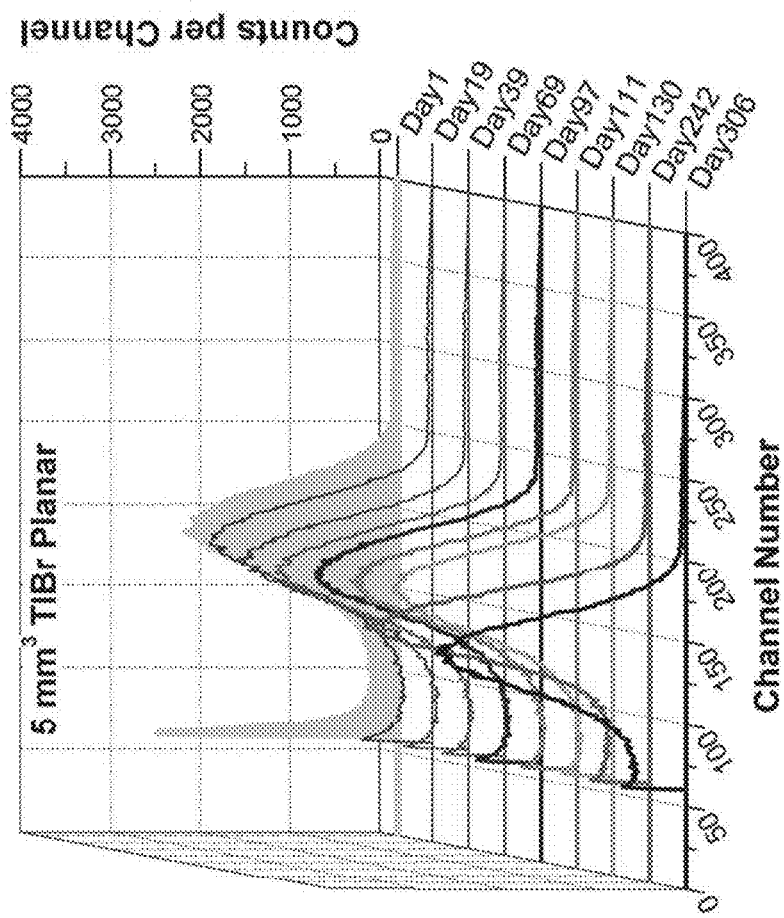

A radiation detector comprising a 5 mm-thick layer comprising TlBr and 2.2 ppm Ba was fabricated. A continuous bias voltage of 500 V was applied to the detector, and the detector was exposed to a $^{241}$Am source emitting 60 keV gamma rays. From FIG. 2A, which shows a plot of peak position as a function of time, it can be seen that after a short conditioning period, during which time the detector response changed before it stabilized, the detector response was relatively constant over about 280 days of use. The long-term stability of the radiation detector can also be evaluated from FIG. 2B, which illustrates pulse height spectra over 306 days of use. FIG. 2B shows that there was little variation in peak position over the 306 days.

Radiation detectors comprising TlBr and varying amounts of Ba were also formed. The amount of barium in the samples was determined through glow discharge mass spectrometry (GDMS). Resistivity and electron mobility-lifetime products were also obtained for each sample. The Ba content, resistivity, and electron mobility-lifetime products for each sample are shown in Table 1.

TABLE 1

| Sample # | Ba content (ppm) | Resistivity (ohm-cm) | $(\mu\tau)_e$ ($cm^2/V$) |
|---|---|---|---|
| 1 | 1.3 | $6.4 \times 10^{10}$ | $1.0 \times 10^{-3}$ |
| 2 | 2.2 | $7.9 \times 10^{10}$ | $1.5 \times 10^{-3}$ |
| 3 | 1.9 | $1.9 \times 10^{11}$ | $1.3 \times 10^{-3}$ |
| 4 | 0.79 | $7.8 \times 10^{10}$ | $4.0 \times 10^{-4}$ |
| 5 | 2.6 | $5.7 \times 10^{10}$ | $1.2 \times 10^{-4}$ |

TABLE 1-continued

| Sample # | Ba content (ppm) | Resistivity (ohm-cm) | $(\mu\tau)_e$ (cm$^2$/V) |
|---|---|---|---|
| 6 | 6 | $1.1 \times 10^{11}$ | $2.0 \times 10^{-3}$ |
| 7 | 4.1 | $1.7 \times 10^{11}$ | $1.0 \times 10^{-3}$ |
| 8 | 1.7 | $1.2 \times 10^{11}$ | $3.5 \times 10^{-4}$ |

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed.

What is claimed is:

1. A device comprising:
   a composition consisting essentially of:
   a thallium halide and/or an indium halide; and
   one or more dopants comprising at least barium, wherein the composition is in the form of a planar layer.

2. The device of claim 1, wherein the thallium halide comprises TlBr.

3. The device of claim 1, wherein the dopant is in ionic form.

4. A radiation detector, comprising the device of claim 1.

5. The device of claim 4, wherein the detector has a resistivity of greater than or equal to about $1 \times 10^{11}$ ohm-cm.

6. The radiation detector of claim 4, wherein the detector has a stability of greater than about 200 days at room temperature under continuous bias of 500 V.

7. A method of detecting radiation, comprising:
   exposing a radiation detector to a source of radiation, wherein the radiation detector comprises the device of claim 1; and
   generating an electrical signal.

8. The method of claim 7, wherein the source of radiation emits gamma rays.

9. The method of claim 7, further comprising detecting the electrical signal.

10. The composition of claim 1, wherein the layer has a thickness of greater than or equal to about 0.5 mm.

* * * * *